United States Patent
Xie

(10) Patent No.: US 8,482,297 B2
(45) Date of Patent: Jul. 9, 2013

(54) SYSTEM FOR TESTING POWER SUPPLY PERFORMANCE

(75) Inventor: Ling-Yu Xie, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 482 days.

(21) Appl. No.: 12/770,786

(22) Filed: Apr. 30, 2010

(65) Prior Publication Data

US 2011/0175640 A1 Jul. 21, 2011

(30) Foreign Application Priority Data

Jan. 18, 2010 (CN) .......................... 2010 1 0300410

(51) Int. Cl.
*G01R 27/32* (2006.01)

(52) U.S. Cl.
USPC ......................................... 324/647; 324/555

(58) Field of Classification Search
USPC ......................................................... 324/771
See application file for complete search history.

(56) References Cited

U.S. PATENT DOCUMENTS

| 4,255,792 | A | * | 3/1981 | Das ............................. 702/117 |
| 5,804,999 | A | * | 9/1998 | DeBoer et al. ................. 327/110 |
| 5,966,078 | A | * | 10/1999 | Tanguay .................... 340/636.1 |
| 2004/0105664 | A1 | * | 6/2004 | Ivankovic ..................... 388/800 |

* cited by examiner

*Primary Examiner* — Thomas Valone
(74) *Attorney, Agent, or Firm* — Altis Law Group, Inc.

(57) ABSTRACT

A system for testing a DC power supply performance includes a comparison module, a judge module, and an alarm module. The comparison module receives DC voltage signals from the DC power supply, compares the DC voltage signals with a reference voltage respectively, and outputs a voltage level signal when the DC power supply is normal. The judge module receives the voltage level signal, and outputs a control signal according to the voltage level signal. The alarm module receives the control signal, and indicates status of the DC power supply according to the control signal.

8 Claims, 2 Drawing Sheets

# SYSTEM FOR TESTING POWER SUPPLY PERFORMANCE

BACKGROUND

1. Technical Field

The present disclosure relates to testing systems, and particularly to a system for testing power supply performance.

2. Description of Related Art

Most electronic apparatuses are not equipped with internal power supply devices in order to save space and costs. Therefore, these electronic apparatuses require external power supplies. Computers are powered by power supplies, which are capable of converting alternating current into direct current. Testing power supplies over or under voltages is an important test for determining reliability. The reliability of power supplies is measured by comparing the input and output voltages of the power supplies and by measuring the output voltages of the power supply to test if they are within allowable limits. However, the above testing method needs a special test apparatus to test the power supply, which increases the testing cost.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

In general, the word "module," as used herein, refers to logic embodied in hardware or firmware, or to a collection of software instructions, written in a programming language, such as, for example, Java, C, or Assembly. One or more software instructions in the modules may be embedded in firmware, such as an EPROM. It will be appreciated that modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1:
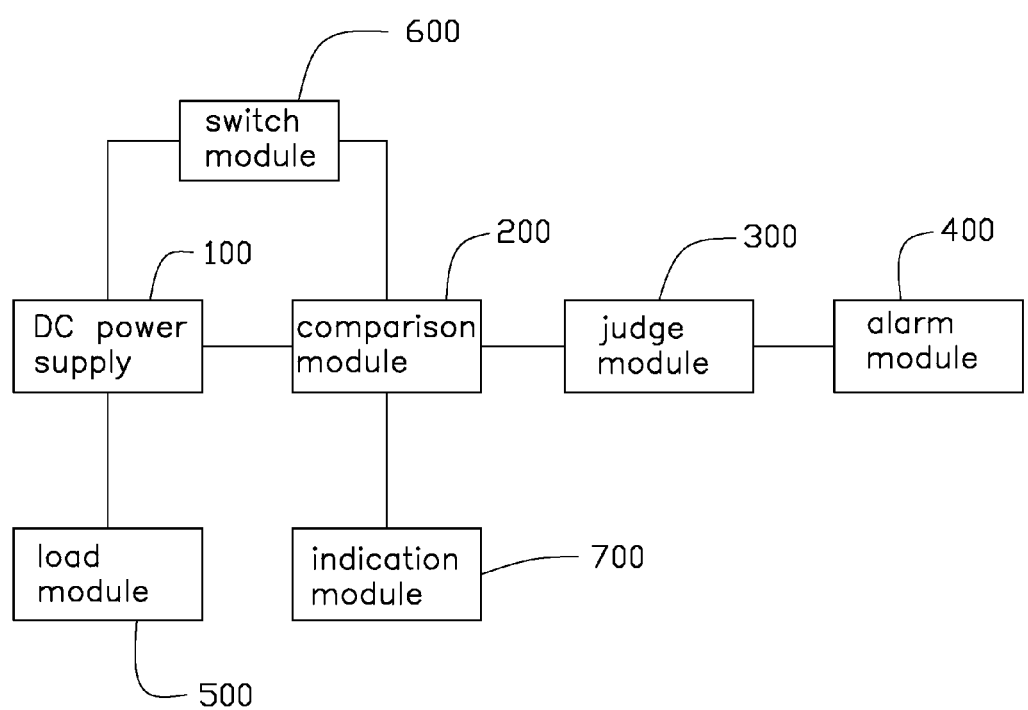
FIG. 1 is a block view of an embodiment of a system for testing power supply performance.

Referring to FIG. 1, a system in an embodiment for testing power supply performance includes a DC power supply 100, a comparison module 200, a judge module 300, an alarm module 400, a load module 500, a switch module 600, and an indication module 700. The DC power supply 100 includes a plurality of output terminals for outputting +5VSB (standby voltage of +5V), +5V, +3.3V, +12V, −12V, PS-ON (Power Supply On) and PG (Power Good) voltage signals.

Figure 2:
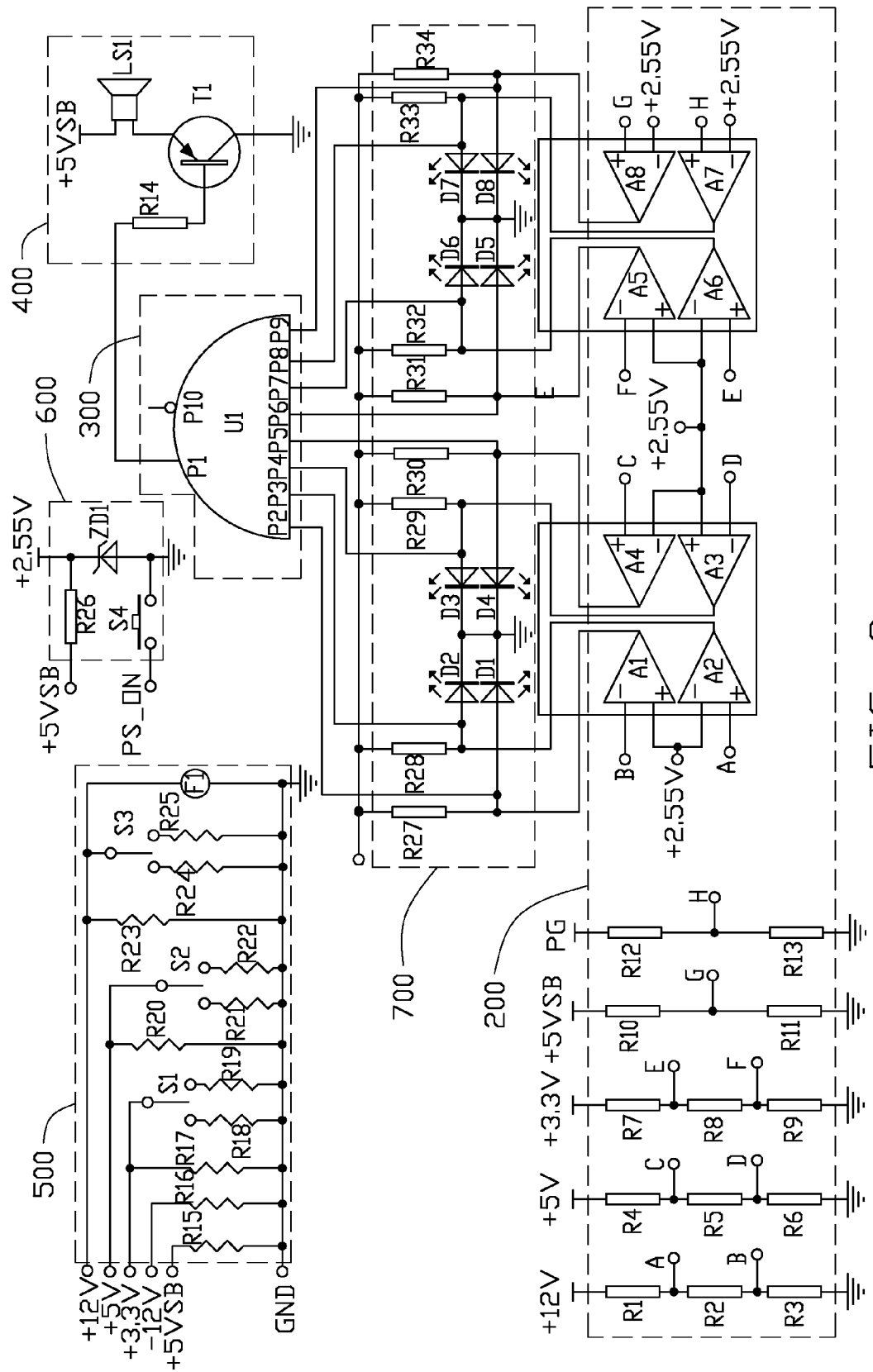
FIG. 2 is a schematic view of the system of FIG. 1.

Referring to FIG. 2, the comparison module 200 includes comparators A1~A8 and resistors R1~R13. A non-inverting input terminal of the comparator A1 and an inverting input terminal of the comparator A2 receive a reference voltage respectively. An inverting input terminal of the comparator A1 is grounded via the resistor R3. A non-inverting input terminal of the comparator A2 is electrically coupled to the +12V voltage output terminal via the resistor R1. The resistor R2 is electrically coupled between the inverting input terminal of the comparator A1 and the non-inverting input terminal of the comparator A2. A non-inverting input terminal of the comparator A3 and an inverting input terminal of the comparator A4 receive the reference voltage respectively. An inverting input terminal of the comparator A3 is grounded via the resistor R6. A non-inverting input terminal of the comparator A4 is electrically coupled to the +5V voltage output terminal via the resistor R4. The resistor R5 is electrically coupled between the inverting input terminal of the comparator A3 and the non-inverting input terminal of the comparator A4.

A non-inverting input terminal of the comparator A5 and an inverting input terminal of the comparator A6 receive the reference voltage respectively. An inverting input terminal of the comparator A5 is grounded via the resistor R9. A non-inverting input terminal of the comparator A6 is electrically coupled to the +3.3V voltage output terminal via the resistor R7. The resistor R8 is electrically coupled between the inverting input terminal of the comparator A5 and the non-inverting input terminal of the comparator A6. An inverting input terminal of the comparator A7 and an inverting input terminal of the comparator A8 receive the reference voltage respectively. The non-inverting input terminal of the comparator A7 is electrically coupled to the PG voltage output terminal via the resistor R12. The non-inverting input terminal of the comparator A7 is grounded via the resistor R13. The non-inverting input terminal of the comparator A8 is electrically coupled to the +5VSB voltage output terminal via the resistor R10. The non-inverting input terminal of the comparator A8 is grounded via the resistor R11. In one embodiment, the reference voltage is 2.55 volts.

The judge module 300 includes a NAND element U1 having input ports P2~P9 and output ports P1 and P10. Output terminals of the comparators A1~A8 are electrically coupled to the input ports P2~P9. The alarm module 400 includes a transistor T1, a buzzer LS1, and a resistor R14. A base of the transistor T1 is electrically coupled to the output port P1 via the resistor R14. An emitter of the transistor T1 is electrically coupled to the +5VSB voltage output terminal via the buzzer LS1. A collector of the transistor T1 is grounded. In one embodiment, the NAND element U1 is a CD4068 type NAND. The transistor T1 is a PNP type transistor.

The load module 500 includes multiple switches S1~S3, a fan F1, and resistors R15~R25. The +5VSB, −12V, +3.3V, +5V, and +12V voltage output terminals are grounded via the resistors R15~R17, R20, and R23 respectively. The +3.3V voltage output terminal is electrically coupled to a first terminal of the multiple switch S1. A second terminal of the multiple switch S1 and a third terminal of the multiple switch S1 are grounded via the resistors R18 and R19. The +5V voltage output terminal is electrically coupled to a first terminal of the multiple switch S2. A second terminal of the multiple switch S2 and a third terminal of the multiple switch S2 are grounded via the resistors R21 and R22. The +12V voltage output terminal is electrically coupled to a first terminal of the multiple switch S3. A second terminal of the multiple switch S3 and a third terminal of the multiple switch S3 are grounded via the resistors R24 and R25. The +12V voltage output terminal is also grounded via the fan F1 to drive the fan F1 rotating and dissipating heat for the load module 500.

The switch module 600 includes a press stopper S4, a Zener diode ZD1, and a resistor R26. The +5VSB voltage output terminal is electrically coupled to a cathode of the Zener diode ZD1 via the resistor R26. The PS-ON voltage output terminal is electrically coupled to an anode of the Zener diode ZD1 via the press stopper S4. The anode of the Zener diode ZD1 is grounded. A connection point between the cathode of the Zener diode ZD1 and the resistor R26 outputs the reference voltage. The indication module 700 includes LEDs D1~D8 and resistors R27~R34. The output terminals of the comparators A1~A8 are grounded via the LEDs D1~D8 respectively. The output terminals of the comparators A1~A8 are also electrically coupled to the +5VSB voltage output terminal via the resistors R27~R34 respectively.

During a test, the DC power supply 100 is electrically coupled to the test system as shown in FIG. 2. The press stopper S4 is pressed once, and then it is released. The PS-ON voltage signal is output. Then +5VSB, +5V, +3.3V, +12V, −12V, and PG voltage signals are output. When the voltage output terminals output normal voltage signals, the output terminals of the comparators A1~A8 output high voltage levels. The high voltage levels are received by the judge module 300. The judge module 300 also outputs a high voltage level. The alarm module 400 receives the high voltage level and the transistor T1 turns off. The buzzer LS1 does not buzz, and the LEDs D1~D8 emit light to indicate the DC power supply 100 is normal. If a certain voltage output terminal, for example the +12V voltage output terminal outputs an over voltage signal. The output terminal of the comparator A1 outputs a low voltage level, and the output terminal of the comparator A2 outputs a high voltage level. The judge module 300 outputs a low voltage level. The alarm module 400 receives the low voltage level and the transistor T1 turns on. The buzzer LS1 buzzes to indicate the DC power supply 100 is abnormal. The LED D1 does not emit light to indicate the +12V voltage output terminal outputs an over voltage signal.

If a certain voltage output terminal, for example the +12V voltage output terminal outputs an under voltage signal. The output terminal of the comparator A1 outputs a high voltage level, and the output terminal of the comparator A2 outputs a low voltage level. The judge module 300 outputs a low voltage level. The alarm module 400 receives the low voltage level and the transistor T1 turns on. The buzzer LS1 buzzes to indicate the DC power supply 100 is abnormal. The LED D2 does not emit light indicating the +12V voltage output terminal outputs an under voltage signal.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A system for testing a DC power supply performance, comprising:
    a comparison module capable of receiving DC voltage signals from the DC power supply, comparing the DC voltage signals with a reference voltage respectively, and outputting a voltage level signal when the DC power supply is normal;
    a judge module capable of receiving the voltage level signal, and outputting a control signal according to the voltage level signal; and
    an alarm module capable of receiving the control signal, and indicating status of the DC power supply according to the control signal; wherein the DC power supply comprises a first voltage output terminal; the comparison module comprises a first comparator, a second comparator, a first resistor, a second resistor, and a third resistor; a non-inverting input terminal of the first comparator and an inverting input terminal of the second comparator are capable of receiving the reference voltage; an inverting input terminal of the first comparator is grounded via the third resistor; a non-inverting input terminal of the second comparator is electrically coupled to the first voltage output terminal via the first resistor; the second resistor is electrically coupled between the inverting input terminal of the first comparator and the non-inverting input terminal of the second comparator.

2. The system of claim 1, further comprising a load module having a first resistor, a second resistor, and a fan; the DC power supply comprises a first voltage output terminal and a second voltage output terminal; the first voltage output terminal is grounded via the first resistor and the fan respectively; the second voltage output terminal is grounded via the second resistor.

3. The system of claim 2, further comprising a switch module having a press stopper, a Zener diode, and a third resistor; the DC power supply further comprises a third voltage output terminal; the second voltage output terminal is electrically coupled to a cathode of the Zener diode via the third resistor; the third voltage output terminal is electrically coupled to an anode of the Zener diode via the press stopper; the anode of the Zener diode is grounded; a connection point between the cathode of the Zener diode and the third resistor is capable of outputting the reference voltage.

4. The system of claim 1, further comprising an indication module having a first LED and a second LED; output terminals of the first and second comparators are electrically coupled to anodes of the first and second LEDs respectively; cathodes of the first and second LEDs are grounded.

5. The system of claim 4, wherein the judge module comprises a NAND element; output terminals of the first and second comparators are electrically coupled to a first input terminal and a second input terminal of the NAND element respectively.

6. The system of claim 5, wherein the DC power supply further comprises a second voltage output terminal; the comparison module further comprises a third comparator, a fourth resistor, and a fifth resistor; an inverting input terminal of the third comparator is capable of receiving the reference voltage; a non-inverting input terminal of the third comparator is electrically coupled to the second voltage output terminal via the fourth resistor; the non-inverting input terminal of the third comparator is also grounded via the fifth resistor; an output terminal of the third comparator is electrically coupled to a third input terminal of the NAND element.

7. The system of claim 6, wherein the alarm module comprises a transistor and a buzzer; a base of the transistor is electrically coupled to an output terminal of the NAND element; an emitter of the transistor is electrically coupled to the second voltage output terminal via the buzzer; a collector of the transistor is grounded.

8. The system of claim 7, wherein the reference voltage is 2.55 volts; the transistor is a PNP type transistor.

* * * * *